(12) United States Patent
Liu et al.

(10) Patent No.: US 6,399,286 B1
(45) Date of Patent: Jun. 4, 2002

(54) METHOD OF FABRICATING REDUCED CRITICAL DIMENSION FOR CONDUCTIVE LINE AND SPACE

(75) Inventors: Yuan-Hung Liu; Bor-Wen Chan, both of Hsinchu (TW)

(73) Assignee: Taiwan Semiconductor Manufacturing Corp., Hsinchu (TW)

( * ) Notice: Subject to any disclaimer, the term of this patent is extended or adjusted under 35 U.S.C. 154(b) by 0 days.

(21) Appl. No.: 09/384,013

(22) Filed: Aug. 26, 1999

(30) Foreign Application Priority Data

Jun. 23, 1999 (TW) .......................................... 88110532

(51) Int. Cl.⁷ .............................................. G03F 7/36
(52) U.S. Cl. ...................... 430/316; 430/314; 430/317; 430/318; 216/66; 438/40; 438/673; 438/713
(58) Field of Search ................................. 430/314, 318, 430/316, 317; 216/66; 438/40, 673, 713

(56) References Cited

U.S. PATENT DOCUMENTS

| | | | | | |
|---|---|---|---|---|---|
| 5,340,773 A | * | 8/1994 | Yamamoto | .................. | 437/230 |
| 5,668,039 A | * | 9/1997 | Lin | ............................. | 438/387 |
| 6,022,776 A | * | 2/2000 | Lien | ............................ | 438/253 |
| 6,063,708 A | * | 5/2000 | Lee | ............................... | 438/692 |
| 6,110,837 A | * | 8/2000 | Linliu | ......................... | 438/723 |
| 6,177,331 B1 | * | 1/2001 | Koga | .......................... | 438/424 |
| 6,232,175 B1 | * | 5/2001 | Liu et al. | ..................... | 438/253 |

* cited by examiner

Primary Examiner—Mark F. Huff
Assistant Examiner—Nicole Barreca
(74) Attorney, Agent, or Firm—Jiawei Huang; J.C. Patents

(57) ABSTRACT

A fabrication method for reducing the critical dimension of the conductive line and the space is described in which a conductive layer and a mask layer are sequentially formed on a substrate. A taper etching is conducted to form a plurality of first openings with the cross-sections of the openings being tapered off from top to bottom and exposing the surface of the conductive layer. A planarized sacrificial layer at a similar height as the mask layer is formed covering the exposed surface of the conductive layer. A second taper etching is further conducted on the exposed mask layer to form a plurality of second openings with the cross-sections of the openings being tapered off from top to bottom. The sacrificial layer is then removed. Thereafter, an anisotropic etching is conducted on the exposed conductive layer, using the mask layer as a hard mask, to form a plurality of conductive lines followed by a removal of the mask layer.

21 Claims, 3 Drawing Sheets

METHOD OF FABRICATING REDUCED CRITICAL DIMENSION FOR CONDUCTIVE LINE AND SPACE

CROSS-REFERENCE TO RELATED APPLICATION

This application claims the priority benefit of Taiwan application serial no. 88110532, filed Jun. 23, 1999.

BACKGROUND OF THE INVENTION

1. Field of the Invention

The present invention relates to a fabrication method for a semiconductor device. More particularly, the present invention relates to a fabrication method for reducing the critical dimensions for the conductive lines and the space in between.

2. Description of the Related Art

In the fabrication of a semiconductor device, the resolution of the photolithography technique is limited, even though the short wave length deep ultraviolet (DUV) light is used. For example, the photolithography resolution of a DUV with a wavelength of 248 nm, is around 0.18 to 0.2 mm. A further increase in the density of a semiconductor device is thereby limited by the resolution of the current photolithography technique.

SUMMARY OF THE INVENTION

The present invention provides a method of fabricating a reduced critical dimension for the conductive line and the space to overcome the resolution limitation of the photolithography technique. This invention includes forming sequentially a material layer and a mask layer on a substrate, wherein the material layer, for example, is a conductive layer. A first taper etching is conducted to form multiple first openings with the cross-sections of the openings being tapered off from top to bottom exposing the surface of the material layer. A sacrificial layer is then formed on the exposed surface of the material layer. A second taper etching is conducted on the exposed mask layer to form multiple second openings with the cross-sections of the openings being tapered off from top to bottom. The sacrificial layer is then removed. Thereafter, an anisotropic etching is conducted to remove the exposed material layer, with the mask layer serving as a hard mask, forming multiple conductive lines followed by a removal of the mask layer.

According to the present invention, the critical dimension of the conductive line and of the space can be reduced. The conductive line width is a sum of the distance of the sidewalls of the first and the second openings being tapered off after the first and the second taper etching. The space between the conductive lines is at least a line width less than the regular photolithography resolution.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENT

FIGS. 1A to 1G are schematic, cross-sectional views of a semiconductor device showing the fabrication method for reducing the critical dimension of the conductive line and the space.

Figure 1A:
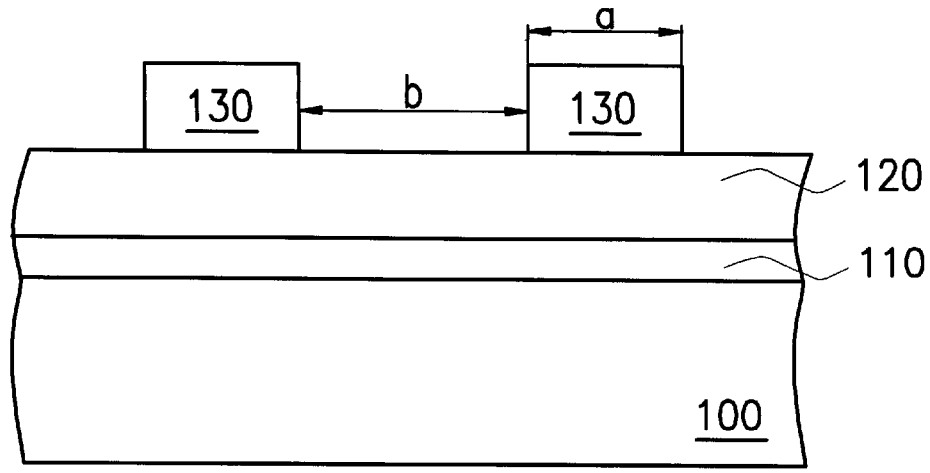
FIGS. 1A to 1G are schematic, cross-sectional views of a semiconductor device showing the fabrication method for reducing the critical dimension of the conductive line and the space.

Referring to FIG. 1A, a conductive layer 110 and a mask layer 120 are sequentially deposited on a substrate 100. The conductive layer 110, including doped polysilicon, aluminum and copper type of conductive materials, are formed by sputtering or chemical vapor deposition. The mask layer 120, on the other hand, including silicon oxide and silicon nitride, is made of different materials and comprises a different etching selectivity from the conductive layer 110.

A photoresist layer is formed on the mask layer by spin-coating, and is then patterned by conventional photolithography and etching process into a patterned photoresist 130 on the mask layer 120. The pattern of the patterned photoresist 130 is defined by a width "a" of the photoresist and a width "b" of the interval spacing separating two adjacent portions with a width "a" of the patterned photoresist.

Figure 1B:
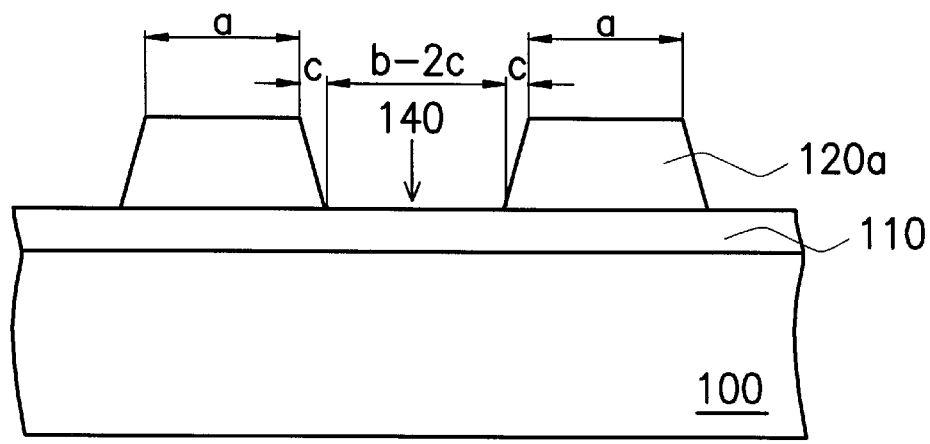

With the photoresist layer 130 serving as a mask, as shown in FIG. 1B, a first taper etching is conducted on the mask layer 120 to form a patterned mask layer 120a with an opening 140 in which its cross-section is tapered off from top to bottom. If a sidewall of the opening 140 is reclined as in FIG. 1B, the width of the opening 140 at the bottom is reduced by "c". If both sidewalls of the opening are reclined and the width of the opening is also reduced by "c" at each sidewall, the width of the opening is totally reduced by "2c". Since the width of the opening 140 at the top is "b", the width of the opening at the bottom becomes "b–2c". Correspondingly, the width of the bottom of the patterned mask layer is increased to "a+2c". After which, the photoresist layer 130 is removed.

If the mask layer 120 is silicon oxide, a reactive ion etching, for example, can be conducted using the $CH_2F_2$/$C_4F_8$/Ar ion as a gas source at flow rates of 4 to 8 sccm, 8 to 14 sccm and 400 to 500 sccm respectively and at a reaction chamber pressure of approximately 30 to 50 mtorr. The flow rate of $CH_2F_2$ is controlled such that the degree of inclination of the opening 140 sidewall is adjusted to approximately between 85 to 87°. Hence, the degree of inclination and the thickness of the mask layer 120 determine the extent of "c", wherein c is degree of reduction of the width of the opening 140 at the bottom due to a relining sidewall.

Figure 1C:
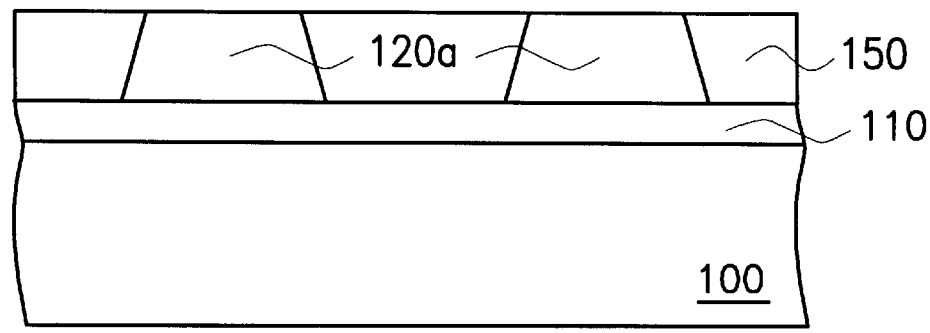

As shown in FIG. 1C, a fluid material, with a good void filling capability, is formed on the conductive layer 110, forming a planarized sacrificial layer 150. The sacrificial layer 150, for example, an organic material used for the bottom anti-reflection coating (BARC), is of a different material and comprises a different etching selectivity from the mask layer 120a. In the current preferred embodiment, the sacrificial layer is formed covering the conductive layer 110 and the mask layer 120a. The portion of the sacrificial layer 150 above the mask layer 120a is then removed, for example by an etch back process, leaving only the portion of the sacrificial layer 150 having the same height as the mask layer 120a. This invention, however, is also applicable to have the sacrificial layer 150 formed with its height higher or lower than the mask layer 120a.

If the sacrificial layer 150 is an organic bottom anti-reflection coating, it is removed by, for example, dry etching using an end-point detector (EPD) system with the mask layer 120a serving as an etch stop. The gas source for dry etching plasma includes $CO/C_4F_8/Ar/O_2$ at flow rates of 20 sccm to 50 sccm, 10 sccm to 14 sccm, 100 sccm to 200 sccm, and 10 sccm to 20 sccm respectively, and at a reaction chamber pressure of approximately 40 to 50 mTorr.

Figure 1D:
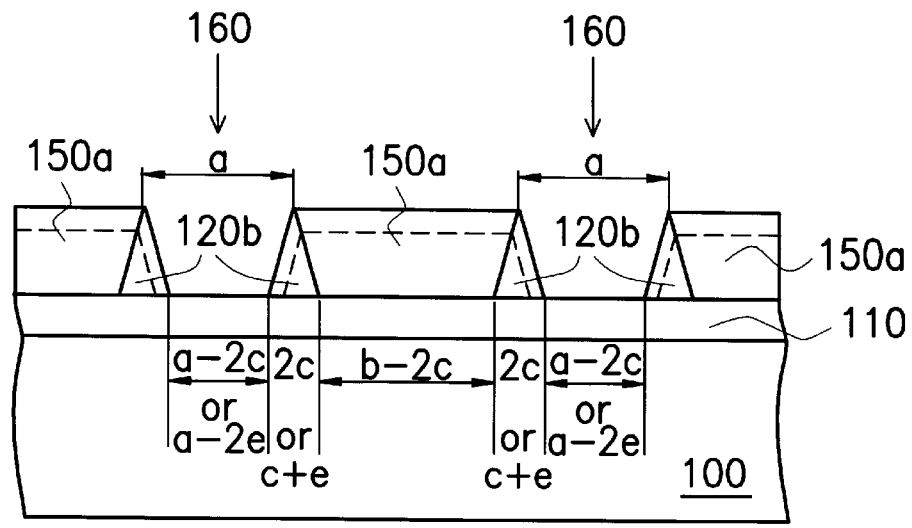

As illustrated in FIG. 1D, a second tapered etching is further conducted to etch the mask layer 120a (as shown in FIG. 1C), using the sacrificial layer 150 as a hard mask layer, to form the openings 160 and the patterned mask layer 120b. If the mask layer 120b is silicon oxide and the sacrificial layer 150a is an organic BARC, the etching conditions can be similar to those illustrated in FIG. 1B, wherein the etching selectivity of silicon oxide to BARC can reach a rate 6:9. The bottom side of each mask layer 120b thus has a width "2c". Correspondingly, the top of the opening 160 has a width a while the bottom has a width (a−2c), due to tapered etching.

If the sacrificial layer 150 formed is lower than the mask layer 120 (as in FIG. 1B), the width of the bottom of each mask layers 120b is thus less than "2c" as illustrated by the dotted line in FIG. 1D.

Figure 2:
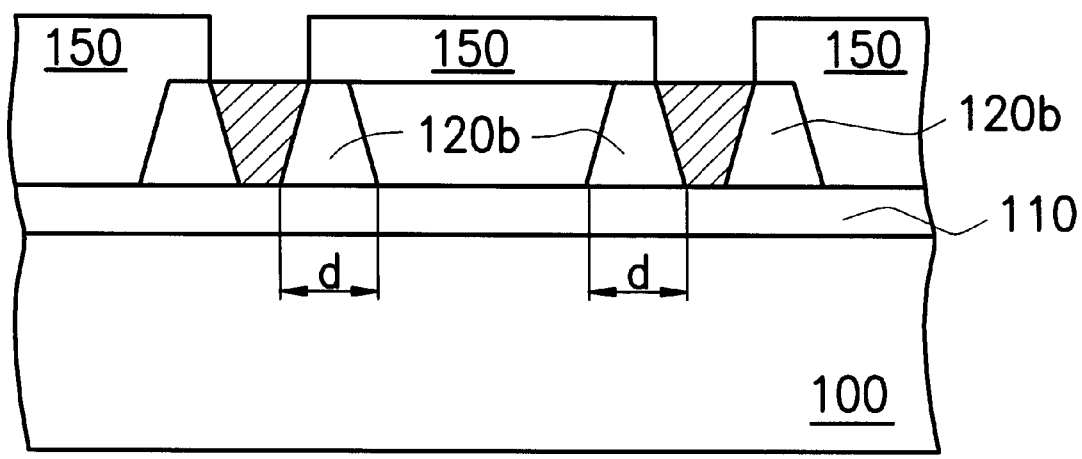
FIG. 2 is a schematic, cross-sectional view showing the step of the second taper etching, in which the sacrificial layer formed is higher than the mask layer.

As shown in FIG. 2, when the sacrificial layer 150 (as in FIG. 1B) is higher than the mask layer 120a (as in FIG. 1B), the sacrificial layer 150 is patterned and a portion of the sacrificial layer 150 is removed to expose a portion of the mask layer 120a surface, using the mask layer 120a as an etch stop. The second taper etching is then conducted to etch the mask layer 120a (as in FIG. 1C) to form the mask layer 120b, wherein the width of the bottom of each mask layer 120b is greater "2c". As illustrated in FIG. 2, the portion of the mask layer (as indicated by the shade area in FIG. 2) is removed by taper etching to form a mask layer 120b with the width of its bottom equal to "d", where "d" is greater than "2c".

Again referring to FIG. 1D where the second etching step is being performed, if the etching condition, such as the flow rate of $CH_2F_2$ is altered, the degree of inclination of the sidewalls of the opening 160 will be different from that of the first etching step. If the bottom of the opening 160 is tapered off to a value of "a−2e", the width of the bottom of each mask layer 120b is "c+e".

Figure 1E:
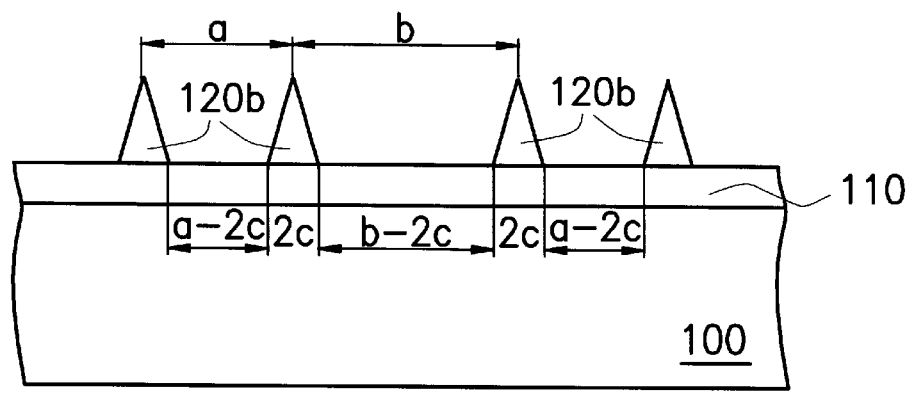

Continuing to FIG. 1E, the remaining sacrificial layer 150a is removed, and the distances between the adjacent mask layers is either "a−2c" or "b−2c", if the second taper etching conditions are same as those of the first taper etching step. If the sacrificial layer 150a is an organic BARC, a common dry etching for removing a photoresist can be applied using oxygen plasma.

Figure 1F:
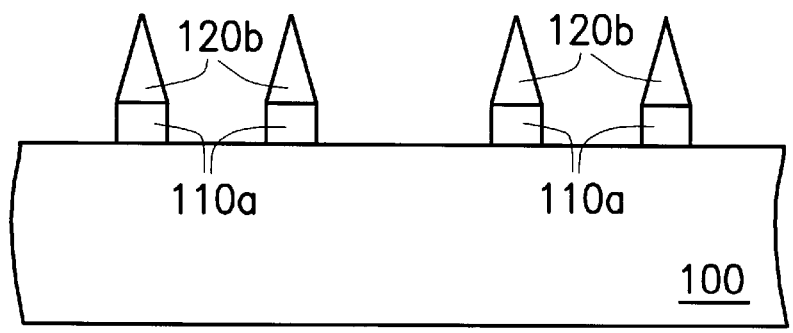

Referring to FIG. 1F, the exposed conductive layer 110 is removed, with the mask layer 120b serving as hard masks, to form a conductive line 110a with a line width of "2c". If the conductive layer 110 is, for example, doped polysilicon, a reactive ion etching using chlorine ion as a gas source can be conducted, in which the etching selectivity of doped polysilicon to silicon oxide is about 40 to 100 with the mask layers 120b being silicon oxide. If the conductive layer 110 is aluminum and the mask layer 120b is silicon oxide, a reactive ion etching using chlorine ion as a gas source still can be conducted with an etching selectivity of aluminum to silicon oxide being approximately 10 to 16.

Figure 1G:
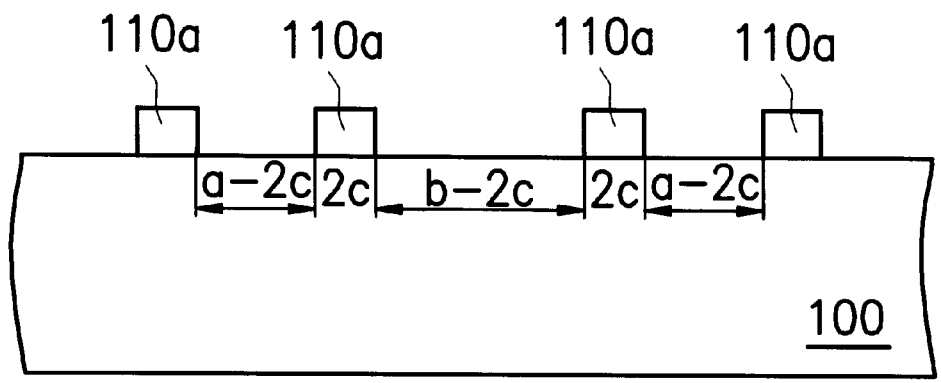

As shown in FIG. 1G, the mask layers 120b are removed, leaving the conductive lines 110a on the substrate 100. If the mask layer 120b is silicon oxide, it is removed, for example, by a reactive ion etching using a fluorine ion gas source or a hydrogen fluoride (HF) solution.

Based on the present invention, when the conductive layer 110 is doped polysilicon and the mask layer 120 is silicon oxide, the line width of the doped polysilicon conductive line, determined under a scanning electron microscope (SEM), is approximately 0.079 micron. The distance between the adjacent doped polysilicon conductive lines is approximately 0.204 micron.

According to the preferred embodiment of the present invention, the present invention overcomes the limitations of the photolithography resolution in fabricating a conductive line with a reduced critical dimension. Hence, the device density and the efficiency of the semiconductor circuitry are greatly increased. Although in the above embodiment, the present invention has been described with respect a conductive line with a reduced critical dimension, the invention is applicable also to other devices of a semiconductor device with reduced critical dimensions.

It is to be understood that both the foregoing general description and the following detailed description are exemplary, and are intended to provide further explanation of the invention as claimed.

What is claimed is:

1. A fabrication method for reducing a critical dimension of a conductive line and a space comprising the steps of:

providing a substrate;

forming a conductive layer on the substrate;

forming a mask layer on the conductive layer;

performing a first tapered etching on the mask layer till the conductive layer is exposed through a plurality of first openings, wherein the first openings are tapered off from top to bottom;

forming a planarized sacrificial layer to fill the first tapered openings;

performing a second tapered etching on the mask layer till the conductive layer is exposed through a plurality of second openings, wherein the second openings are tapered off from top to bottom;

removing the sacrificial layer;

patterning the conductive layer using the mask layer as a patterned hard mask; and removing the patterned mask layer.

2. The fabrication method for reducing a critical dimension of a conductive line and a space according to claim 1, wherein the conductive layer includes doped polysilicon.

3. The fabrication method for reducing a critical dimension of a conductive line and a space according to claim 1, wherein the conductive layer includes aluminum.

4. The fabrication method for reducing a critical dimension of a conductive line and a space according to claim 1, wherein the conductive layer includes copper.

5. The fabrication method for reducing a critical dimension of a conductive line and a space according to claim 1, wherein the mask layer includes silicon oxide layer.

6. The fabrication method for reducing a critical dimension of a conductive line and a space according to claim 1, wherein the first taper etching includes reactive ion etching.

7. The fabrication method for reducing a critical dimension of a conductive line and a space according to claim 6, wherein conditions for reactive ion etching include using a reactive gas source of $CH_2F_2/C_4F_8/Ar$ at flow rates of 4 to 8 sccm, 8 to 14 sccm and 400 to 500 sccm respectively and at a reaction chamber pressure of 30 to 50 mtorr.

8. The fabrication method for reducing a critical dimension of a conductive line and a space according to claim 1, wherein the sacrificial layer includes a material formed in a fluid phase.

9. The fabrication method for reducing a critical dimension of a conductive line and a space according to claim 1, wherein the sacrificial layer includes an organic bottom anti-reflection coating.

10. The fabrication method for reducing a critical dimension of a conductive line and a space according to claim 1, wherein the second taper etching includes reaction ion etching.

11. A fabrication method for overcoming limitations of a photolithography resolution in forming a conductive line and a space of reduced dimensions, the method comprising the steps of:

forming a substrate;

forming a conductive layer on the substrate;

forming a mask layer on the conductive layer;

conducting a first taperd etching to form a plurality of first openings, wherein cross-sections of the first openings are being tapered off from top to bottom and a surface of the conductive layer is exposed;

forming a sacrificial layer on the conductive layer;

conducting a second taper etching on the mask layer to form a plurality of openings, wherein cross-sections of the second openings are being tapered off from top to bottom and a surface of the conductive layer is exposed;

removing the sacrificial layer;

removing the exposed conductive layer; and removing the patterned mask layer.

12. The method for overcoming limitations of a photolithography resolution according to claim 11, wherein before the step of the second taper etching on the mask layer with the sacrificial layer higher than the mask layer, the method further comprising the step of:

patterning the sacrificial layer to expose a portion of a surface of the mask layer.

13. The method for overcoming the limitations of the photolithography resolution according to claim 11, wherein the conductive layer includes doped polysilicon.

14. The method for overcoming the limitations of the photolithography resolution according to claim 11, wherein the conductive layer includes aluminum.

15. The method for overcoming the limitations of the photolithography resolution according to claim 11, wherein the conductive layer includes copper.

16. The method for overcoming the limitations of the photolithography resolution according to claim 15, wherein the step of forming the mask layer includes chemical vapor deposition.

17. The method for overcoming the limitations of the photolithography resolution according to claim 11, wherein the mask layer includes a silicon oxide layer.

18. The method for overcoming the limitations of the photolithography resolution according to claim 11, wherein the first and the second taper etching steps include performing reactive ion etching.

19. The method to overcome the limitations of the photolithography resolution according to claim 11, wherein the sacrificial layer includes an organic bottom anti-reflection coating.

20. A fabrication method for patterning a mask layer into a tapered patterned mask with reduced dimensions of the masking regions, comprising:

providing a substrate;

forming a material layer;

forming a mask layer;

performing two tapered etching processes respectively on distinct regions of the mask layer to form a tapered patterned mask layer and expose the material layer;

performing an anisotropic etching to remove the exposed material layer; and removing the tapered patterned mask layer.

21. A fabrication method for reducing a critical dimension of a conductive line and a space comprising the steps of:

providing a substrate;

forming a conductive layer on the substrate;

forming a mask layer on the conductive layer;

performing a first tapered etching on the mask layer till the conductive layer is exposed through a plurality of first openings;

forming a planarized sacrificial layer to fill the first tapered openings;

performing a second tapered etching on the mask layer till the conductive layer is exposed through a plurality of second openings, such that the dimensions of the regions of the conductive layer masked by the mask layer are reduced compared to the dimensions of the regions of the conductive layer masked by the mask layer after the first tapered etching;

removing the sacrificial layer;

patterning the conductive layer using the mask layer as a patterned hard mask; and removing the patterned mask layer.

* * * * *